(12) United States Patent
Xu et al.

(10) Patent No.: US 11,302,634 B2
(45) Date of Patent: Apr. 12, 2022

(54) MICROELECTRONIC DEVICES WITH SYMMETRICALLY DISTRIBUTED STAIRCASE STADIUMS AND RELATED SYSTEMS AND METHODS

(71) Applicant: Micron Technology, Inc., Boise, ID (US)

(72) Inventors: Lifang Xu, Boise, ID (US); Jian Li, Boise, ID (US); Graham R. Wolstenholme, Boise, ID (US); Paolo Tessariol, Arcore (IT); George Matamis, Eagle, ID (US); Nancy M. Lomeli, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 16/790,148

(22) Filed: Feb. 13, 2020

(65) Prior Publication Data
US 2021/0257298 A1    Aug. 19, 2021

(51) Int. Cl.
*H01L 23/528* (2006.01)
*H01L 23/522* (2006.01)
*H01L 21/768* (2006.01)
*H01L 27/11582* (2017.01)
*H01L 27/11556* (2017.01)

(52) U.S. Cl.
CPC .... *H01L 23/5283* (2013.01); *H01L 21/76816* (2013.01); *H01L 21/76877* (2013.01); *H01L 23/5226* (2013.01); *H01L 27/11556* (2013.01); *H01L 27/11582* (2013.01)

(58) Field of Classification Search
CPC ......... H01L 21/76816; H01L 21/76877; H01L 23/5226; H01L 23/5283; H01L 27/11556; H01L 27/11582
See application file for complete search history.

(56) References Cited

U.S. PATENT DOCUMENTS

| | | | |
|---|---|---|---|
| 8,759,217 B1 * | 6/2014 | Chen | H01L 21/76838 438/689 |
| 9,165,937 B2 | 10/2015 | Yip et al. | |
| 9,589,978 B1 | 3/2017 | Yip | |
| 9,659,950 B2 | 5/2017 | Yip et al. | |
| 9,748,257 B2 | 8/2017 | Lee et al. | |
| 9,870,941 B2 | 1/2018 | Ha et al. | |
| 9,905,514 B2 | 2/2018 | Tanzawa | |
| 9,941,209 B2 | 4/2018 | Tessariol et al. | |
| 10,043,751 B2 | 8/2018 | Thimmegowda et al. | |
| 10,147,638 B1 | 12/2018 | Williamson et al. | |

(Continued)

*Primary Examiner* — Allan R Wilson
(74) *Attorney, Agent, or Firm* — TraskBritt

(57) ABSTRACT

Microelectronic devices include stadium structures within a stack structure and substantially symmetrically distributed between a first pillar structure and a second pillar structure, each of which vertically extends through the stack structure. The stack structure includes a vertically alternating sequence of insulative materials and conductive materials arranged in tiers. Each of the stadium structures includes staircase structures having steps including lateral ends of some of the tiers. The substantially symmetrical distribution of the stadium structures, and fill material adjacent such structures, may substantially balance material stresses to avoid or minimize bending of the adjacent pillars. Related methods and systems are also disclosed.

27 Claims, 10 Drawing Sheets

(56) References Cited

U.S. PATENT DOCUMENTS

| | | |
|---|---|---|
| 10,249,345 B2 | 4/2019 | Yip |
| 10,290,581 B2 | 5/2019 | Tessariol et al. |
| 10,373,970 B2 | 8/2019 | Lee |
| 10,418,072 B2 | 9/2019 | Yip |
| 2012/0261722 A1 | 10/2012 | Tang et al. |
| 2012/0306089 A1 | 12/2012 | Freeman et al. |
| 2014/0162420 A1* | 6/2014 | Oh ................ H01L 27/11582 |
| | | 438/270 |
| 2016/0020169 A1* | 1/2016 | Matsuda .......... H01L 27/11548 |
| | | 257/758 |
| 2017/0256551 A1* | 9/2017 | Lee ................ H01L 27/11582 |
| 2018/0082940 A1 | 3/2018 | Sorensen et al. |
| 2018/0190587 A1 | 7/2018 | Park et al. |
| 2018/0331034 A1 | 11/2018 | Thimmegowda et al. |
| 2019/0081061 A1 | 3/2019 | Tessariol et al. |
| 2019/0259703 A1 | 8/2019 | Tessariol et al. |
| 2021/0151455 A1 | 5/2021 | Xu et al. |

\* cited by examiner

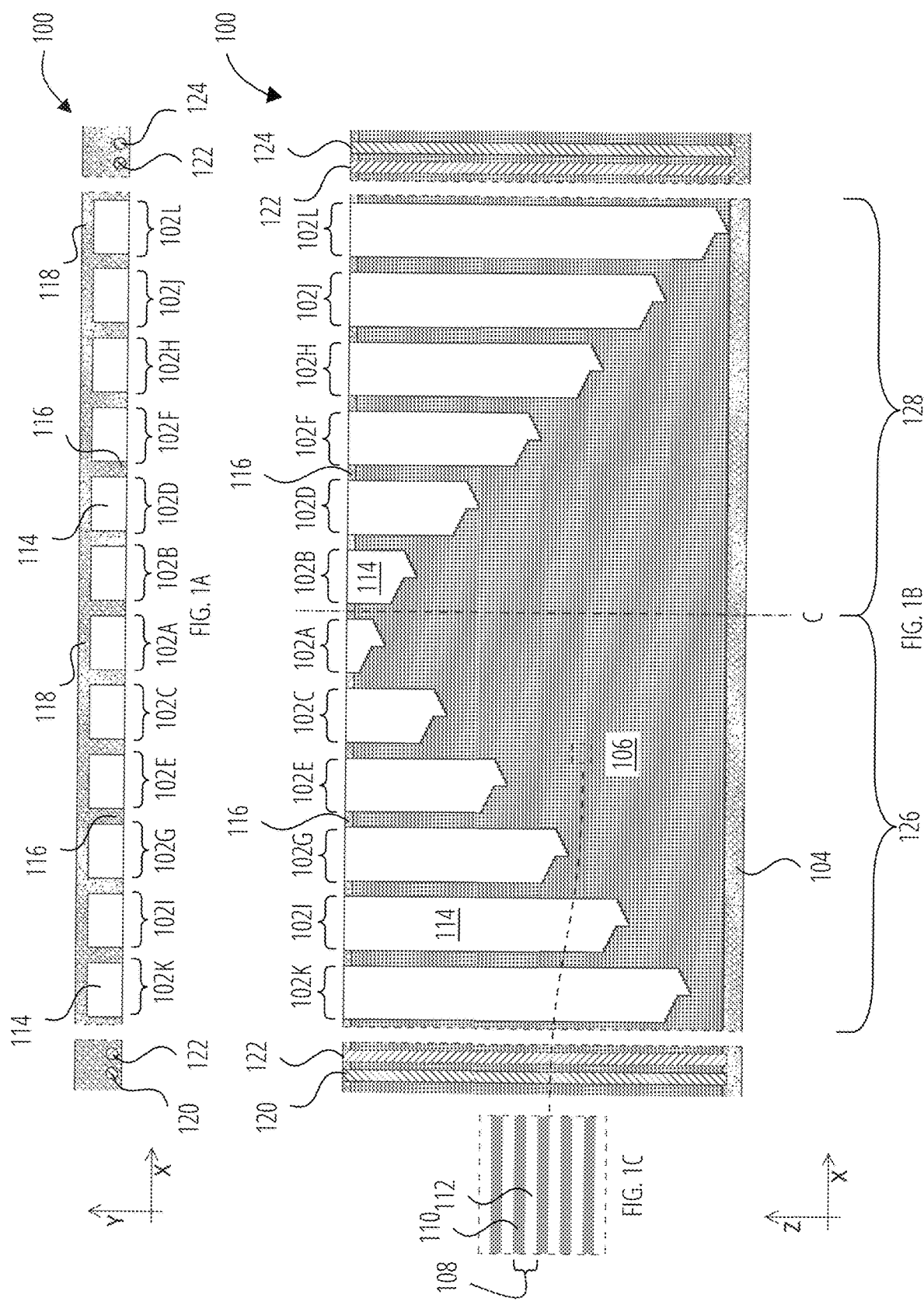

MICROELECTRONIC DEVICES WITH SYMMETRICALLY DISTRIBUTED STAIRCASE STADIUMS AND RELATED SYSTEMS AND METHODS

TECHNICAL FIELD

Embodiments of the disclosure relate to the field of microelectronic device design and fabrication. More particularly, the disclosure relates to microelectronic devices (e.g., memory devices, such as 3D NAND memory devices) having staircase structures arranged in substantially symmetrically distributed stadiums, to related methods and to systems incorporating such devices.

BACKGROUND

Memory devices provide data storage for electronic systems. A Flash memory device is one of various memory device types and has numerous uses in modern computers and other electrical devices. A conventional Flash memory device may include a memory array that has a large number of charge storage devices (e.g., memory cells, such as non-volatile memory cells) arranged in rows and columns. In a NAND architecture type of Flash memory, memory cells arranged in a column are coupled in series, and a first memory cell of the column is coupled to a data line (e.g., a bit line). In a "three-dimensional NAND" memory device (which may also be referred to herein as a "3D NAND" memory device), a type of vertical memory device, not only are the memory cells arranged in row and column fashion in a horizontal array, but tiers of the horizontal arrays are stacked over one another (e.g., as vertical strings of memory cells) to provide a "three-dimensional array" of the memory cells. The stack of tiers vertically alternate conductive materials with insulating (e.g., dielectric) materials. The conductive materials function as control gates for, e.g., access lines (e.g., word lines) of the memory cells. Vertical structures (e.g., pillars comprising channel structures) extend along the vertical string of memory cells. A drain end of a string is adjacent one of the top and bottom of the vertical structure (e.g., pillar), while a source end of the string is adjacent the other of the top and bottom of the pillar. The drain end is operably connected to a bit line, while the source end is operably connected to a source line. 3D NAND memory devices also include electrical connections between, e.g., access lines (e.g., word lines) and other conductive structures of the device so that the memory cells of the vertical strings can be selected for writing, reading, and erasing operations. String drivers drive the access line (e.g., word line) voltages to write to or read from the memory cells of the vertical string.

One method of forming such electrical connections includes forming a so-called "staircase" structure having "steps" (or otherwise known as "stairs") at edges (e.g., lateral ends) of the tiers of the stack structure. The steps define contact regions of conductive structures of the device, such as access lines (e.g., word lines), which may be formed by the conductive materials of the tiered stack. Contact structures can be formed in contact with the steps to provide electrical access to a conductive structure (e.g., a word line) associated with each respective step.

A continued goal in the microelectronic device fabrication industry is to improve the performance of devices, e.g., 3D NAND memory devices, by decreasing the electrical resistance and/or electrical capacitance of the word lines. However, efforts to decrease electrical resistance and/or capacitance of word lines may negatively impact other aspects of device design and fabrication, such as by introducing pillar bending in areas of the device adjacent the staircase structures. Therefore, designing and fabricating microelectronic devices, such as 3D NAND memory devices, with decreased electrical resistance and/or capacitance and without pillar bending continues to present challenges.

BRIEF DESCRIPTION OF THE DRAWINGS

FIG. 1A is a cross-sectional, top, plan, schematic illustration of a microelectronic device structure, according to embodiments of the disclosure, with substantially symmetrically distributed stadiums.

FIG. 1B is a cross-sectional, front, elevational, schematic illustration of the microelectronic device structure of FIG. 1A, wherein stadium depth increases with lateral distance from a centerline and wherein the stadiums have offset opposing staircase structures, a right-side staircase structure thereof being downwardly offset from a left-side staircase structure.

FIG. 1C is an enlarged, schematic illustration of a portion of the stack structure of the microelectronic device structure of FIG. 1A and FIG. 1B, the portion being that indicated by the dashed-line box of FIG. 1B.

FIG. 6A through FIG. 9 are cross-sectional, elevational, schematic illustrations during various stages of processing to fabricate the microelectronic device structure illustrated in FIG. 1B, according to embodiments of the disclosure. With regard to FIG. 6A and FIG. 6B, these figures together illustrate a stage of the processing, with FIG. 6B being an enlarged, schematic illustration of a portion of the structure of FIG. 6A, namely, the portion indicated by the dashed-line box in FIG. 6A.

DETAILED DESCRIPTION

Figure 2B:
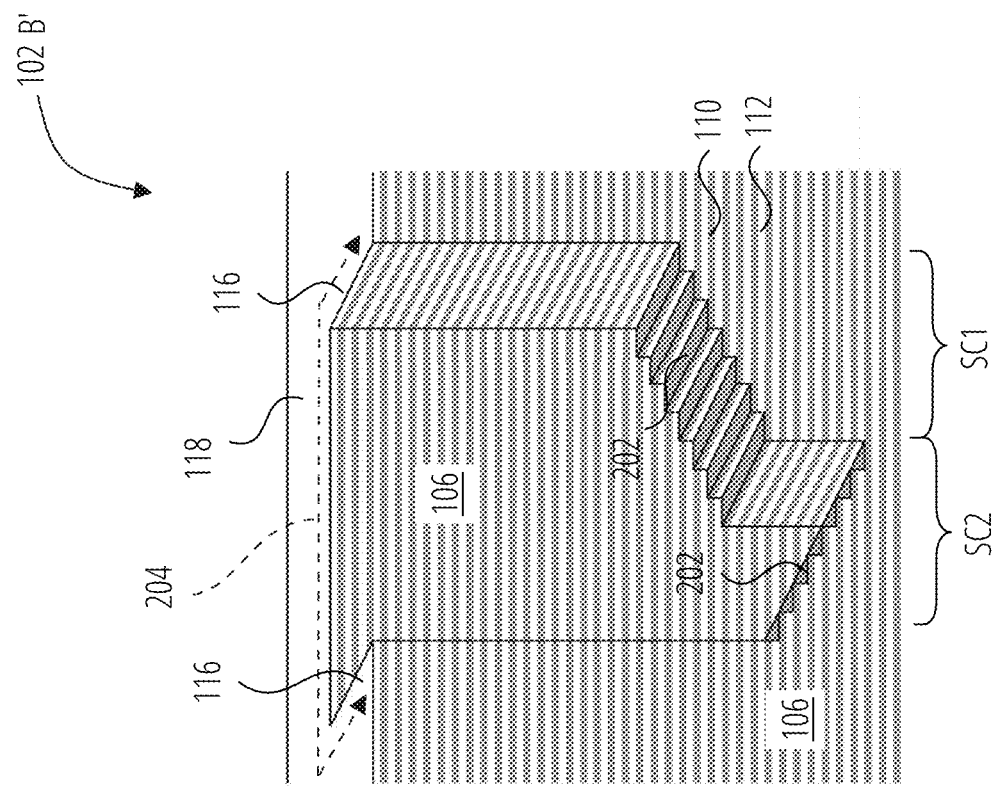
FIG. 2B is a cross-sectional, front and top perspective, schematic illustration of a stadium of a microelectronic device structure, according to embodiments of the disclosure, the stadium being horizontally inverse of the stadium of FIG. 2A, such that the stadium of FIG. 2B has offset opposing staircase structures with a left-side staircase structure thereof downwardly offset from a right-side staircase structure.

Structures (e.g., microelectronic device structures), apparatuses (e.g., microelectronic devices), and systems (e.g., electronic systems), according to embodiments of the disclosure, include stadiums of varying depths with the stadiums being substantially symmetrically distributed between laterally adjacent pillars (e.g., between laterally adjacent vertical arrays of memory cells). This substantially symmetrical distribution of stadiums enables the microelectronic device structure to be configured for low electrical resistance and low electrical capacitance of word lines while also balancing, about a centerline of the distribution, fill material volume and material stresses so that bending of adjacent pillars is avoided or is minimal and consistent, enabling minimal and consistent mitigation of pillar bending on both sides of the stadium distribution.

As used herein, the term "opening" means a volume extending through at least one structure or at least one material, leaving a gap in that at least one structure or at least one material, or a volume extending between structures or materials, leaving a gap between the structures or materials. Unless otherwise described, an "opening" is not necessarily empty of material. That is, an "opening" is not necessarily void space. An "opening" formed in or between structures or materials may comprise structure(s) or material(s) other than that in or between which the opening is formed. And, structure(s) or material(s) "exposed" within an opening is (are) not necessarily in contact with an atmosphere or non-solid environment. Structure(s) or material(s) "exposed" within an opening may be adjacent or in contact with other structure(s) or material(s) that is (are) disposed within the opening.

As used herein, the term "substrate" means and includes a base material or other construction upon which components, such as those within memory cells, are formed. The substrate may be a semiconductor substrate, a base semiconductor material on a supporting structure, a metal electrode, or a semiconductor substrate having one or more materials, structures, or regions formed thereon. The substrate may be a conventional silicon substrate or other bulk substrate including a semiconductive material. As used herein, the term "bulk substrate" means and includes not only silicon wafers, but also silicon-on-insulator ("SOT") substrates, such as silicon-on-sapphire ("SOS") substrates or silicon-on-glass ("SOG") substrates, epitaxial layers of silicon on a base semiconductor foundation, or other semiconductor or optoelectronic materials, such as silicon-germanium ($Si_{1-x}Ge_x$, where x is, for example, a mole fraction between 0.2 and 0.8), germanium (Ge), gallium arsenide (GaAs), gallium nitride (GaN), or indium phosphide (InP), among others. Furthermore, when reference is made to a "substrate" in the following description, previous process stages may have been utilized to form materials, structures, or junctions in the base semiconductor structure or foundation.

As used herein, the terms "horizontal" or "lateral" mean and include a direction that is parallel to a primary surface of the substrate on which the referenced material or structure is located. The width and length of a respective material or structure may be defined as dimensions in a horizontal plane. With reference to the figures, the "horizontal" direction may be perpendicular to an indicated "Z" axis and may be parallel to an indicated "X" axis and an indicated "Y" axis.

As used herein, the terms "vertical" or "longitudinal" mean and include a direction that is perpendicular to a primary surface of the substrate on which a referenced material or structure is located. The height of a respective material or structure may be defined as a dimension in a vertical plane. With reference to the figures, the "vertical" direction may be parallel to an indicated "Z" axis and may be perpendicular to an indicated "X" axis and an indicated "Y" axis.

As used herein, the terms "thickness" or "thinness" mean and include a dimension in a straight-line direction that is normal to the closest surface of an immediately adjacent material or structure that is of a different composition or that is otherwise distinguishable from the material or structure whose thickness, thinness, or height is discussed.

As used herein, the term "between" is a spatially relative term used to describe the relative disposition of one material, structure, or sub-structure relative to at least two other materials, structures, or sub-structures. The term "between" may encompass both a disposition of one material, structure, or sub-structure directly adjacent the other materials, structures, or sub-structures and a disposition of one material, structure, or sub-structure indirectly adjacent to the other materials, structures, or sub-structures.

As used herein, the term "proximate" is a spatially relative term used to describe disposition of one material, structure, or sub-structure near to another material, structure, or sub-structure. The term "proximate" includes dispositions of indirectly adjacent to, directly adjacent to, and internal to.

As used herein, the term "neighboring," when referring to a material or structure, means and refers to a next, most proximate material or structure of an identified composition or characteristic. Materials or structures of other compositions or characteristics than the identified composition or characteristic may be disposed between one material or structure and its "neighboring" material or structure of the identified composition or characteristic. For example, a structure of material X "neighboring" a structure of material Y is the first material X structure, e.g., of multiple material X structures, that is next most proximate to the particular structure of material Y. The "neighboring" material or structure may be directly or indirectly proximate the structure or material of the identified composition or characteristic.

As used herein, the terms "about" and "approximately," when either is used in reference to a numerical value for a particular parameter, are inclusive of the numerical value and a degree of variance from the numerical value that one of ordinary skill in the art would understand is within acceptable tolerances for the particular parameter. For example, "about" or "approximately," in reference to a numerical value, may include additional numerical values within a range of from 90.0 percent to 110.0 percent of the numerical value, such as within a range of from 95.0 percent to 105.0 percent of the numerical value, within a range of from 97.5 percent to 102.5 percent of the numerical value, within a range of from 99.0 percent to 101.0 percent of the numerical value, within a range of from 99.5 percent to 100.5 percent of the numerical value, or within a range of from 99.9 percent to 100.1 percent of the numerical value.

As used herein, the term "substantially," when referring to a parameter, property, or condition, means and includes the parameter, property, or condition being equal to or within a degree of variance from a given value such that one of ordinary skill in the art would understand such given value to be acceptably met, such as within acceptable manufacturing tolerances. By way of example, depending on the particular parameter, property, or condition that is substantially met, the parameter, property, or condition may be "substantially" a given value when the value is at least 90.0% met, at least 95.0% met, at least 99.0% met, or even at least 99.9% met.

As used herein, reference to an element as being "on" or "over" another element means and includes the element being directly on top of, adjacent to (e.g., laterally adjacent to, vertically adjacent to), underneath, or in direct contact with the other element. It also includes the element being indirectly on top of, adjacent to (e.g., laterally adjacent to, vertically adjacent to), underneath, or near the other element, with other elements present therebetween. In contrast, when an element is referred to as being "directly on" or "directly adjacent to" another element, there are no intervening elements present.

As used herein, other spatially relative terms, such as "below," "lower," "bottom," "above," "upper," "top," and the like, may be used for ease of description to describe one element's or feature's relationship to another element(s) or feature(s) as illustrated in the figures. Unless otherwise specified, the spatially relative terms are intended to encompass different orientations of the materials in addition to the orientation as depicted in the figures. For example, if materials in the figures are inverted, elements described as "below" or "under" or "on bottom of" other elements or features would then be oriented "above" or "on top of" the other elements or features. Thus, the term "below" may encompass both an orientation of above and below, depending on the context in which the term is used, which will be evident to one of ordinary skill in the art. The materials may be otherwise oriented (rotated ninety degrees, inverted, etc.) and the spatially relative descriptors used herein interpreted accordingly.

As used herein, the terms "level" and "elevation" are spatially relative terms used to describe one material's or feature's relationship to another material(s) or feature(s) as illustrated in the figures, using—as a reference point—the primary surface of the substrate on which the reference material or structure is located. As used herein, a "level" and an "elevation" are each defined by a horizontal plane parallel to the primary surface. "Lower levels" and "lower elevations" are nearer to the primary surface of the substrate, while "higher levels" and "higher elevations" are further from the primary surface. Unless otherwise specified, these spatially relative terms are intended to encompass different orientations of the materials in addition to the orientation as depicted in the figures. For example, the materials in the figures may be inverted, rotated, etc., with the spatially relative "elevation" descriptors remaining constant because the referenced primary surface would likewise be respectively reoriented as well.

As used herein, the terms "comprising," "including," "having," and grammatical equivalents thereof are inclusive or open-ended terms that do not exclude additional, unrecited elements or method steps, but these terms also include more restrictive terms "consisting of" and "consisting essentially of" and grammatical equivalents thereof. Therefore, a structure described as "comprising," "including," and/or "having" a material may be a structure that, in some embodiments, includes additional material(s) as well and/or a structure that, in some embodiments, does not include any other material(s). Likewise, a composition (e.g., gas) described as "comprising," "including," and/or "having" a species may be a composition that, in some embodiments, includes additional species as well and/or a composition that, in some embodiments, does not include any other species.

As used herein, the term "may" with respect to a material, structure, feature, or method act indicates that such is contemplated for use in implementation of an embodiment of the disclosure and such term is used in preference to the more restrictive term "is" so as to avoid any implication that other, compatible materials, structures, features, and methods usable in combination therewith should or must be excluded.

As used herein, "and/or" includes any and all combinations of one or more of the associated listed items.

As used herein, the singular forms "a," "an," and "the" are intended to include the plural forms as well, unless the context clearly indicates otherwise.

As used herein, the terms "configured" and "configuration" mean and refer to a size, shape, material composition, orientation, and arrangement of a referenced material, structure, assembly, or apparatus so as to facilitate a referenced operation or property of the referenced material, structure, assembly, or apparatus in a predetermined way.

The illustrations presented herein are not meant to be actual views of any particular material, structure, sub-structure, region, sub-region, device, system, or stage of fabrication, but are merely idealized representations that are employed to describe embodiments of the disclosure.

Embodiments are described herein with reference to cross-sectional illustrations that are schematic illustrations. Accordingly, variations from the shapes of the illustrations as a result, for example, of manufacturing techniques and/or tolerances, are to be expected. Thus, embodiments described herein are not to be construed as limited to the particular shapes or structures as illustrated but may include deviations in shapes that result, for example, from manufacturing techniques. For example, a structure illustrated or described as box-shaped may have rough and/or nonlinear features. Moreover, sharp angles that are illustrated may be rounded. Thus, the materials, features, and structures illustrated in the figures are schematic in nature and their shapes are not intended to illustrate the precise shape of a material, feature, or structure and do not limit the scope of the present claims.

The following description provides specific details, such as material types and processing conditions, in order to provide a thorough description of embodiments of the disclosed apparatus (e.g., devices, systems) and methods. However, a person of ordinary skill in the art will understand that the embodiments of the apparatus and methods may be practiced without employing these specific details. Indeed, the embodiments of the apparatus and methods may be practiced in conjunction with conventional semiconductor fabrication techniques employed in the industry.

The fabrication processes described herein do not form a complete process flow for processing apparatus (e.g., devices, systems) or the structures thereof. The remainder of the process flow is known to those of ordinary skill in the art. Accordingly, only the methods and structures necessary to understand embodiments of the present apparatus (e.g., devices, systems) and methods are described herein.

Unless the context indicates otherwise, the materials described herein may be formed by any suitable technique including, but not limited to, spin coating, blanket coating, chemical vapor deposition ("CVD"), atomic layer deposition ("ALD"), plasma enhanced ALD, physical vapor deposition ("PVD") (e.g., sputtering), or epitaxial growth. Depending on the specific material to be formed, the technique for depositing or growing the material may be selected by a person of ordinary skill in the art.

Unless the context indicates otherwise, the removal of materials described herein may be accomplished by any suitable technique including, but not limited to, etching (e.g., dry etching, wet etching, vapor etching), ion milling, abrasive planarization, or other known methods.

In referring to the drawings, like numerals refer to like components throughout. The drawings are not necessarily drawn to scale.

FIG. 1A and FIG. 1B, along with FIG. 1C, illustrate a device structure 100, according to embodiments of the disclosure. The device structure 100 includes substantially symmetrically distributed stadiums 102A-L. As used herein, in association with stadiums of a distribution, "A" denotes the stadium of the shallowest depth, "B" denotes the stadium of the second-shallowest depth, and so on until "L" denotes the stadium of the deepest depth.

The device structure 100 includes base material(s) 104 (e.g., materials in and/or supported on a substrate). The base material(s) 104 may include or be configured as drain/source material(s) and may include or be operatively connected to a bit line. Within the base material(s) 104 may be conductive regions for making electrical connections with other conductive structures of the device that includes the device structure 100.

The base material(s) 104 support a stack structure 106 with tiers 108 of vertically alternating conductive material 110 and insulative material 112. Each tier 108 includes a conductive tier of the conductive material 110 and an insulative tier of the insulative material 112. The insulative material 112 includes one or more dielectric material(s), such as oxide material(s) (e.g., silicon oxide). The conductive material 110 includes one or more conductive materials, such as metal(s) (e.g., tungsten), metal-based materials (e.g., tungsten-based materials), conductively-doped materials (e.g., conductively-doped polysilicon), or combinations thereof. In some embodiments, a liner (e.g., a nitride) is included along the conductive material 110.

The stadiums 102A-L are formed in the stack structure 106 and extend vertically downward, from an upper surface of the device structure 100, into the stack structure 106. At the bottom of each of the stadiums 102A-L is at least one staircase structure defining steps (e.g., stairs) at at least one lateral end of the tiers 108. The steps, at each elevation, expose at least one surface of a conductive tier (e.g., of the conductive material 110) of the tiers 108 of the stack structure 106.

Each of the stadiums 102A-L defines a trench that is filled with a fill material 114, e.g., a non-conductive material, such as a dielectric material and/or a polysilicon material. For example, the fill material 114 may be formed of an oxide dielectric material (e.g., silicon dioxide). Conductive contacts may extend through portions of the fill material 114 and/or some or all of the conductive material 110 and insulative material 112 of the stack structure 106 to electrically connect with, e.g., the steps of the staircase structures of the stadiums 102A-L.

Each of the stadiums 102A-L has a different depth. The differing depths of the stadiums 102A-L enable each conductive tier (e.g., of the conductive material 110) having a step in a staircase of the stadiums 102A-L to be independently electrically contacted, e.g., by a conductive contact (not illustrated).

Each of the stadiums 102A-L is spaced from its neighbor by a crest 116, and a bridge 118 extends along and forms a continuous back to each of the stadiums 102A-L. The crests 116 and bridge 118 are formed from and include portions of the tiers 108 of the vertically alternating conductive material 110 and insulative material 112 of the stack structure 106. Therefore, at each conductive tier (e.g., of the conductive material 110), the crests 116 are in electrical connection with one another via the bridge 118.

Within each of the stadiums 102A-L, each conductive tier (e.g., of the conductive material 110), and its step(s), forms a "U"-like shape extending from one side adjacent one of the crests 116, along a portion of the bridge 118, to an opposing side adjacent another of the crests 116. This crest-and-bridge configuration for the stadiums 102A-L (e.g., bi-directional word lines in the stadiums 102A-L) enable operation of the word lines using a central string driver. That is, the device structure 100 is configured in a so-called "central bi-directional staircase" (CBSC) arrangement, wherein one string driver is positioned and configured to drive word lines in tiers 108 disposed on two sides of the string driver. Using such a central string driver enables lower electrical resistance and lower electrical capacitance of the conductive tiers (e.g., word lines formed from the conductive material 110 of the tiers 108) in the stadiums 102A-L, compared to a 3D microelectronic device structure with uni-directional word lines not centrally driven.

To the lateral sides of the distribution of the stadiums 102A-L one or more operationally-active (e.g., electrically functional) pillars (e.g., a left-side pillar 120 and a right-side pillar 124) are disposed, each extending through the stack structure 106. A vertical array of memory cells may extend along each of these so-called "active" pillars. The stadiums 102A-L are substantially symmetrically distributed between the left-side pillar 120 and the right-side pillar 124, e.g., over a width of the device structure 100. Therefore, the stadiums 102A-L are also substantially symmetrical distributed between the vertical arrays of memory cells. The substantially symmetrical distribution of the stadiums 102A-L substantially balances, between the pillars (e.g., the left-side pillar 120 and the right-side pillar 124) and across a centerline C, the volume of the fill material 114 occupying the stadiums 102A-L. The balance of the volume of the fill material 114 substantially balances, between the pillars (e.g., the left-side pillar 120 and the right-side pillar 124) and across the centerline C, material stresses.

As used herein, the term "centerline," as in "centerline C," means and includes a vertical line laterally half-way along a distribution of stadiums 102A-L and/or laterally equidistant from neighboring active pillars (e.g., the left-side pillar 120 and the right-side pillar 124) laterally disposed relative to the distribution of the stadiums (e.g., stadiums 102A-J).

The device structure 100 of FIG. 1A and FIG. 1B includes a distribution of the stadiums 102A-J in which the deepest of the stadiums (e.g., stadium 102K and stadium 102L) are disposed furthest from the centerline C (e.g., nearest the active pillars and, therefore, nearest vertically arrays of memory cells) with the stadium depth steadily decreasing with lateral nearness to the centerline C (e.g., with lateral distality from the active pillars and the vertical arrays of memory cells). A left-side portion 126 of the distribution includes—in lateral order from furthest from the centerline C to closest to the centerline C—stadiums 102K, 102I, 102G, 102E, 102C, and 102A, with stadium 102A being the shallowest stadium of the whole stadium distribution and with stadium 102K being the second-deepest stadium of the whole stadium distribution. Correspondingly, a right-side portion 128 includes—in lateral order from further from the centerline C to closest to the centerline C—stadiums 102L, 102J, 102H, 102F, 102D, and 102B, with stadium 102B being the second-shallowest stadium of the whole stadium distribution and with stadium 102L being the deepest stadium of the whole stadium distribution. Accordingly, the stadium distribution may exhibit a so-called "W" shape. The volume of the fill material 114 occupying the stadiums 102K, 102I, 102G, 102E, 102C, and 102A in the left-side portion 126 is substantially equal to (e.g., substantially balanced with) the volume of the fill material 114 occupying the stadiums 102L, 102J, 102H, 102F, 102D, and 102B in the right-side portion 128.

By substantially symmetrically distributing the stadiums 102A-L between the active pillars (e.g., the left-side pillar 120 and the right-side pillar 124) and about the centerline C, and therefore substantially balancing material stresses between the active pillars and about the centerline C, the left-side pillar 120 and the right-side pillar 124 experience substantially equal amounts of stress (e.g., material stresses), if any.

In some embodiments, the substantial equal balance of material stresses, e.g., between the active pillars (e.g., the left-side pillar 120 and the right-side pillar 124) and about the centerline C, effectively negates the material stresses that would otherwise be experienced by the neighboring active pillars (e.g., the left-side pillar 120 and the right-side pillar 124), leaving a substantially "net zero" stress. Therefore, the active pillars (e.g., the left-side pillar 120 and the right-side pillar 124) may not exhibit any bending, even without any additional mitigating features. For example, the device structure 100 may be free of so-called "dummy" pillars intervening between the distribution of the stadiums 102A-L and the neighboring active pillars (e.g., the left-side pillar 120 and the right-side pillar 124).

In other embodiments, the substantial equal balance of material stresses, e.g., between the active pillars (e.g., the left-side pillar 120 and the right-side pillar 124) and about the centerline C, may substantially reduce the material stresses experienced by the active pillars, such that any bending of the active pillars (in the absence of additional mitigation) may be minimal. Such bending may also be substantially equal at both lateral sides of the distribution of the stadiums 102A-L. In other words, the left-side pillar 120 may (in the absence of additional mitigation) bend a certain amount toward or away from the stadiums 102A-L, and the right-side pillar 124 may (in the absence of additional mitigation) bend the same certain amount toward or away from, respectively, the stadiums 102A-L. Therefore, to further mitigate the bending, an equal number of dummy pillars 122 may be disposed between the distribution of the stadiums 102A-L and the laterally adjacent active pillars (e.g., between the stadiums 102A-L and the left-side pillar 120 and between the stadiums 102A-L and the right-side pillar 124). Accordingly, the substantially symmetrical distribution of the stadiums 102A-L about the centerline C and between the active pillars (e.g., the left-side pillar 120 and the right-side pillar 124) may avoid pillar bending without including dummy pillars 122 or may minimize pillar bending that can be mitigated (e.g., by inclusion of dummy pillars 122) in equal numbers on both lateral sides of the distribution of the stadiums 102A-L.

The configuration of the staircases of the stadiums of microelectronic device structures of embodiments of the disclosure may be tailored according to operative needs for the devices that include such stadiums. For example, in some embodiments, the staircases at the bottom of the stadiums are staircases formed and arranged as opposing staircases that meet at the base of each staircase, forming "V"-shaped opposing staircases. In such a configuration, one conductive tier (e.g., of the tiers 108 (FIG. 1C)) defines a step in each of the staircases, and a contact may be formed to one of the steps to electrically connect the conductive tier to another conductive structure of the device.

Figure 2A:
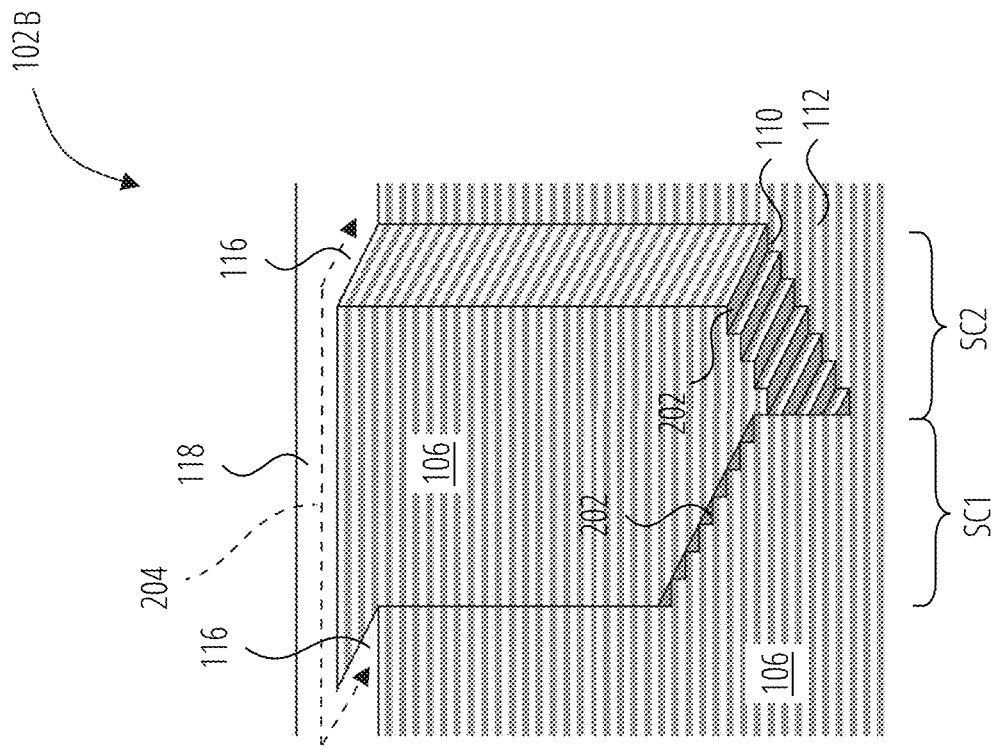
FIG. 2A is a cross-sectional, front and top perspective, schematic illustration of a stadium of the microelectronic device structure of FIG. 1B, according to embodiments of the disclosure, the stadium having offset opposing staircase structures, a right-side staircase structure thereof being downwardly offset from a left-side staircase structure.

In other embodiments, such as illustrated in FIG. 1B, the stadiums 102A-L include staircases that are opposing but offset from one another. More particularly, FIG. 2A illustrates, in enlarged detail, the base of a stadium (e.g., stadium 102B) of a microelectronic device structure (e.g., the device structure 100 of FIG. 1B), according to embodiments of the disclosure. The stadium 102B includes, at the bottom thereof, staircases (e.g., staircase SC1, staircase SC2) that define steps 202 (e.g., at lateral ends of the tier 108 of FIG. 1C in conjunction with FIG. 1B). Each step 202 exposes a portion of an upper surface of the conductive material 110 of a conductive tier of the tiers 108 (FIG. 1C) of the stack structure 106.

Unless otherwise specified, a description of the stadium 102B of FIG. 2A may equally apply to all others of the stadiums 102A-L of FIG. 1B and other figures of the disclosure with the illustrated staircase configuration. For example, the illustration of the stadium 102B of FIG. 2A equally illustrates at least the bottom portion of any of the stadiums 102A-L of FIG. 1B, except that others of the stadiums 102A-L have a different number of tiers 108 (FIG. 1C) above steps 202 of staircases SC1, SC2, depending on the relative depth of the other stadiums 102A-L.

Within the stadium 102B, the staircases SC1, SC2 oppose one another, such that the staircases descending toward one another. The staircases SC1, SC2 are also offset from one another. For example, a bottom step 202 of one staircase (e.g., staircase SC1) is at a higher elevation of the stack structure 106 than the top step 202 of the opposing staircase (e.g., staircase SC2).

The bridge 118 extends along the rear of the stadium 102B, "bridging" each step 202 of the staircases SC1, SC2 and an opposing portion of the crest 116 or the other portion of the stack structure 106. Because of the bridge 118, the conductive material 110 of each respective tier 108 (FIG. 1C) of the crest 116 extends from the left side of the stadium 102B, along the bridge 118, to the right side of the stadium 102B, forming a continuous electrical pathway 204 around the perimeter of the stadium 102B. Therefore, an electrical connection at one of the steps 202 in first staircase SC1 also provides an electrical connection to the opposing portion of the conductive material 110 of that same tier 108 (FIG. 1C), e.g., within the right-side crest 116. Likewise, an electrical connection at one of the steps 202 in the second staircase SC2 also provides an electrical connection to the opposing portion of the conductive material 110 of that same tier 108 (FIG. 1C), e.g., under the step 202 of the first staircase SC1. Therefore, each step 202 of the staircases SC1, SC2 of this offset staircase arrangement may be independently contacted by a contact for electrically connection of that step 202 to another conductive structure of the device. In contrast, in the aforementioned "V"-shaped opposing staircases, a pair of steps of an elevation of non-offset, opposing staircases may not be independently electrically contacted by contacts.

While the stadium 102B of FIG. 2A offsets its opposing staircases SC1, SC2 with a left-side, first staircase SC1 having a base (e.g., lowest of the steps 202) at a higher elevation than a top (e.g., highest of the steps 202) of a right-side, second staircase SC2, in other embodiments, the staircases SC1 and SC2 may be otherwise opposing and offset. For example, FIG. 2B illustrates a stadium 102B', with a higher, first staircase SC1 on the right side of the stadium 102B' and with a lower, second staircase SC2 on the left-side of the stadium 102B'. The stadium 102B' of FIG. 2B, which is essentially a mirror image of the stadium 102B of FIG. 2A may be substituted for any or all of the stadiums of illustrated embodiments of the disclosure (e.g., for any or all of the stadiums 102A-L of FIG. 1B).

The disclosed microelectronic device structure (e.g., the device structure 100 with the stadiums 102A-L of the configuration of the stadium 102B illustrated in FIG. 2A, with the configuration of the stadium 1023 illustrated in FIG. 2B, or with any of the other stadiums distributions of embodiments of the disclosure) is conducive for use in, e.g., 3D NAND with a CBSC arrangement. The crest-and-bridge (e.g., crest 116 and bridge 118) configuration of the stadiums 102A-L enables) a bi-directional word line that can be centrally-driven by a single string driver. This centrally-driven, bi-directional word lines (e.g., of the CBSC arrangement) enable decreased word line resistance and capacitance. Concurrently, the substantially symmetrical distribution of the stadiums (e.g., the stadiums 102A-L) of embodiments of the disclosure mitigate pillar bending without, or with less and equal numbers of, "dummy" pillars on each side of the distribution of the stadiums.

In contrast, it is contemplated that a non-symmetrical distribution of stadiums (e.g., of the stadiums 102A-L of FIG. 1B), even, e.g., with the offset opposing staircases of FIG. 2A, in a 3D NAND device with a CBSC arrangement would experience unbalanced material stresses. Moreover, the active pillar(s) to one lateral side of the stadium distribution may experience a substantial amount of material stresses manifesting as a substantial degree of pillar bending, while another lateral side of the stadium distribution may experience a lesser amount of material stresses manifesting as a lesser degree of pillar bending. Mitigating such un-balanced and substantial pillar bending, e.g., by disposing dummy pillars 122 (FIG. 1B) between the stadiums and the neighboring active pillars, would necessitate different mitigating treatments (e.g., a different number of dummy pillars 122) to one lateral side of the distribution than to the other lateral side. And, the mitigating features (e.g., dummy pillars 122) necessary to mitigate the otherwise-significant pillar bending, in structures without a symmetrical distribution of stadiums, may occupy a significant area of, e.g., the base material(s) 104 (e.g., a wafer), leaving less of the valuable footprint space for electrically-functional features of the device.

Accordingly, disclosed is a microelectronic device comprising a stack structure with a vertically alternating sequence of insulative materials and conductive materials arranged in tiers. A first pillar structure and a second pillar structure vertically extend through the stack structure. Stadium structures are within the stack structure and are substantially symmetrically distributed between the first pillar structure and the second pillar structure. Each of the stadium structures comprise staircase structures having steps comprising lateral ends of some of the tiers.

Figure 3:
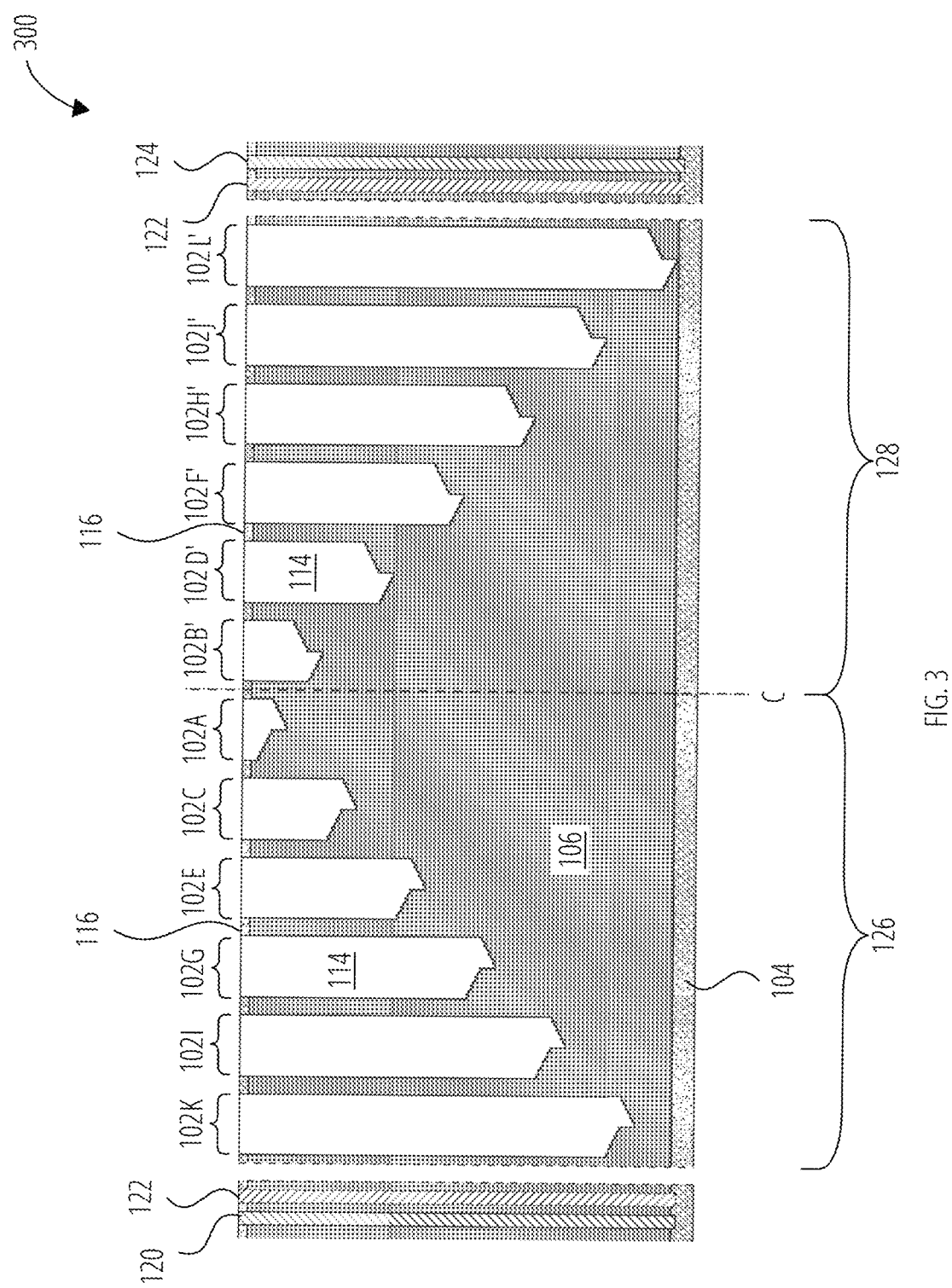
FIG. 3 is a cross-sectional, front, elevational, schematic illustration of a microelectronic device structure, according to embodiments of the disclosure, with substantially symmetrically distributed stadiums, wherein stadium depth increases with lateral distance from a centerline and wherein the stadiums have offset opposing staircase structures, the centerline-side staircase structure thereof being downwardly offset from the exterior-side staircase structure, the stadiums to the left of the centerline having offset opposing staircase structures like that of FIG. 2A and the stadiums to the right of the centerline having offset opposing staircase structures like that of FIG. 2B.

With reference to FIG. 3, illustrated is an embodiment of the disclosure in which the staircases of the stadiums to the left side of the centerline C are horizontally inverted from (e.g., are substantially the mirror image of) the staircases of the stadiums to the right side of the centerline C. This mirrored staircase arrangement may add to the substantial symmetry of the two sides of the distribution of stadiums. More particularly, FIG. 3 illustrates a device structure 300 with a "W"-shaped, substantially symmetrical distribution of stadiums in a manner similar to that of FIG. 1B, but in which the stadiums in the left-side portion 126 (e.g., stadiums 102A, 102C, 102E, 102G, 102I, and 102K) are configured with staircase arrangements like that of the stadium 102B of FIG. 2A, but with the stadiums in the right-side portion 128 (e.g., stadiums 102B', 102D', 102F', 102H', 102J', and 102L') configured with staircase arrangements like that of the stadium 102B' of FIG. 2B.

As with the other device structure embodiments of the disclosure, the device structure 300 of FIG. 3 also includes the crests 116 and the bridge 118 (FIG. 1A, FIG. 2A, FIG. 2B), such that the top plan cross-sectional view of FIG. 1A may be identical to a top plan cross-sectional view of the device structure 300 of FIG. 3, but with the alternative configurations of the staircases of the stadiums (e.g., stadiums 102K, 102I, 102G, 102E, 102C, 102A, 102B', 102D', 102F', 102H', 102J', and 102L', respectively, from left to right across the distribution), discussed above.

As with the device structure 100 of FIG. 1B, the device structure 300 of FIG. 3, includes stadiums substantially symmetrically distributed about the centerline C (and between laterally adjacent active pillars, e.g., the left-side pillar 120 and the right-side pillar 124), with substantially balanced volumes of the fill material 114 and with substantially balanced material stresses. The substantially symmetric distribution of the fill material 114 volumes may, alone, mitigate material stresses, such that no dummy pillars 122 may be needed to prevent bending of the active pillars (e.g., the left-side pillar 120, the right-side pillar 124). In other embodiments, a minimal and equal number of the dummy pillars 122 may be included between the left-side pillar 120 and its neighboring stadium (e.g., stadium 102K) and between the right-side pillar 124 and its neighboring stadium (e.g., stadium 102L').

While the device structure 100 of FIG. 1B and the device structure 300 of FIG. 3 substantially symmetrically distribute stadiums with the deepest stadiums furthest from the centerline C (e.g., nearest the active pillars and, therefore, vertical arrays of memory cells) and with stadium depth decreasing with decreasing lateral distance from the centerline C (e.g., with increasing lateral distance from the active pillars and, therefore, vertical arrays of memory cells) in other embodiments, stadiums may be alternatively arranged by depth but still be substantially symmetrically distributed about the centerline C and between adjacent active pillars (e.g., the left-side pillar 120 and the right-side pillar 124) and, therefore, vertical arrays of memory cells. In other words, any other substantially symmetrical distribution of the stadiums may substantially balance the volume of the fill material 114 about the centerline C (and between the adjacent active pillars) so that material stresses will also be balanced and pillar bending may be mitigated or lessened and further mitigated in equal measure on both sides of the stadium distribution.

Figure 4:
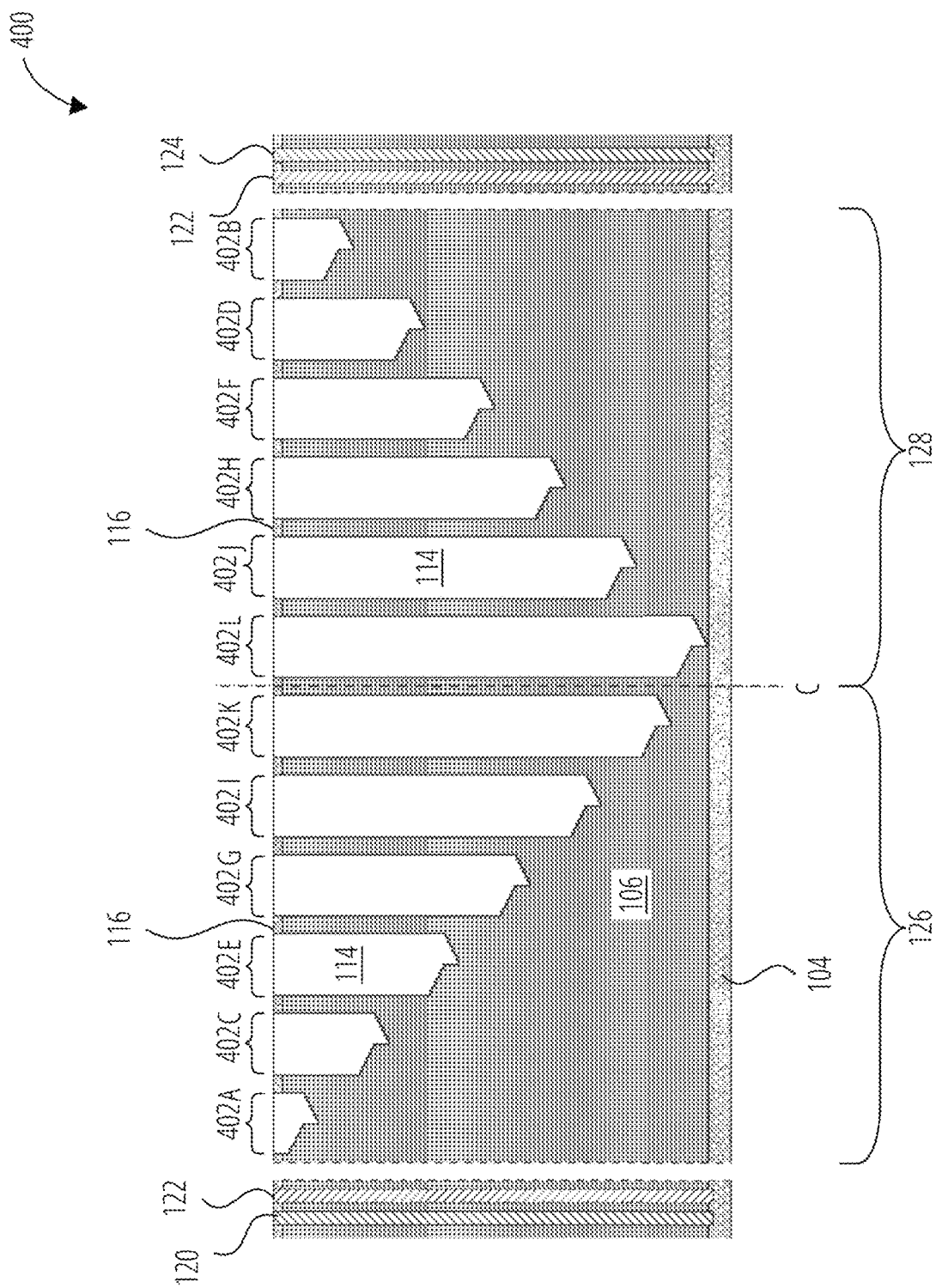
FIG. 4 is a cross-sectional, front, elevational, schematic illustration of a microelectronic device structure, according to embodiments of the disclosure, with substantially symmetrically distributed stadiums, wherein stadium depth decreases with lateral distance from a centerline, the stadiums having offset opposing staircase structures like that of FIG. 2A.

For example, FIG. 4 illustrates a device structure 400 in which stadiums 402A-L are substantially symmetrically distributed about the centerline C (and between the adjacent active pillars, e.g., the left-side pillar 120 and the right-side pillar 124), wherein the deepest stadiums of the distribution are nearest the centerline C and the shallowest stadiums of the distribution are nearest the active pillars (e.g., the left-side pillar 120 and the right-side pillar 124). Therefore, the left-side portion 126 includes—in lateral order from exterior to interior (e.g., from furthest from the centerline C to closest to the centerline C)—stadiums 402A, 402C, 402E, 402G, 402I, and 402K, with stadium 402A being the shallowest stadium of the whole stadium distribution of the device structure 400 and with stadium 402K being the second-deepest stadium of the whole stadium distribution. Correspondingly, the right-side portion 128 includes—in lateral order from exterior to interior (e.g., from further from the centerline C to closest to the centerline C)—stadiums 402B, 402D, 402F, 402H, 402J, and 402L, with stadium 402B being the second-shallowest stadium of the whole stadium distribution of the device structure 400 and with stadium 402L being the deepest stadium of the whole stadium distribution. Accordingly, the stadium distribution may exhibit a so-called "V" shape, with the volume of the fill material 114 occupying the stadiums 402A, 402C, 402E, 402G, 402I, and 402K in the left-side portion 126 being substantially equal to the volume of the fill material 114 occupying the stadiums 402B, 402D, 402F, 402H, 402J, and 402L in the right-side portion 128.

Any or all of the stadiums 402A-L may be configured with the staircase arrangement of either of the stadium 102B of FIG. 2A or the stadium 102B' of FIG. 2B. Therefore, the descriptions of the stadium 102B of FIG. 2A or the stadium 102B' of FIG. 2B may equally apply to any or all of the stadiums 402A-L of FIG. 4.

The device structure 400 also includes the crests 116 and the bridge 118 (FIG. 1A) described above with respect to, e.g., the device structure 100 of FIG. 1B. Therefore, the top plan cross-sectional view of FIG. 1A may be identical to a top plan cross-sectional view of the device structure 400 of FIG. 4, but with the alternative arrangement of stadium depths.

As with the device structure 100 of FIG. 1B and the device structure 300 of FIG. 3, the device structure 400 of FIG. 4, includes stadiums (e.g., the stadiums 402A-L) substantially symmetrically distributed about the centerline C (and between laterally adjacent active pillars, e.g., the left-side pillar 120 and the right-side pillar 124), with substantially balanced volumes of the fill material 114 and with substantially balanced material stresses. The substantially symmetric distribution of the stadiums 402A-L may, alone, mitigate material stresses, such that no dummy pillars 122 may be needed to prevent bending of the active pillars (e.g., the left-side pillar 120, the right-side pillar 124). In other embodiments, a minimal and equal number of the dummy pillars 122 may be included between the left-side pillar 120 and its neighboring stadium (e.g., stadium 402A) and between the right-side pillar 124 and its neighboring stadium (e.g., stadium 402B).

Whether the W-shape stadium distribution of FIG. 1B and FIG. 3 or the V-shape stadium distribution of FIG. 4 is selected and implemented may depend on the relative material stresses of the fill material 114 compared to that of the stack structure 106. The chosen and implemented distribution may be that that best decreases the amount of residual material stress at the lateral sides of the distribution of the stadiums (e.g., along the deepest stadiums 102K and 102L of the device structure 100 of FIG. 1B; along the deepest stadiums 102K and 102L' of the device structure 300 of FIG. 3; or along the shallowest stadiums 402A and 402B of the device structure 400 of FIG. 4).

While the embodiments of FIG. 1B, FIG. 3, and FIG. 4 include distributions in which stadiums in each of the left-side portion 126 and the right-side portion 128 are arranged in order of increasing or decreasing depth, in other embodiments, the stadium depths may vary (e.g., increase, decrease, and increase again; or decrease, increase, and decrease again) along a width of the distribution or portion (e.g., the left-side portion 126, the right-side portion 128) thereof, provided that the volume of the fill material 114 within the stadiums in the left-side portion 126 is substantially equal to the volume of the fill material 114 within the stadiums in the right-side portion 128.

Figure 5:
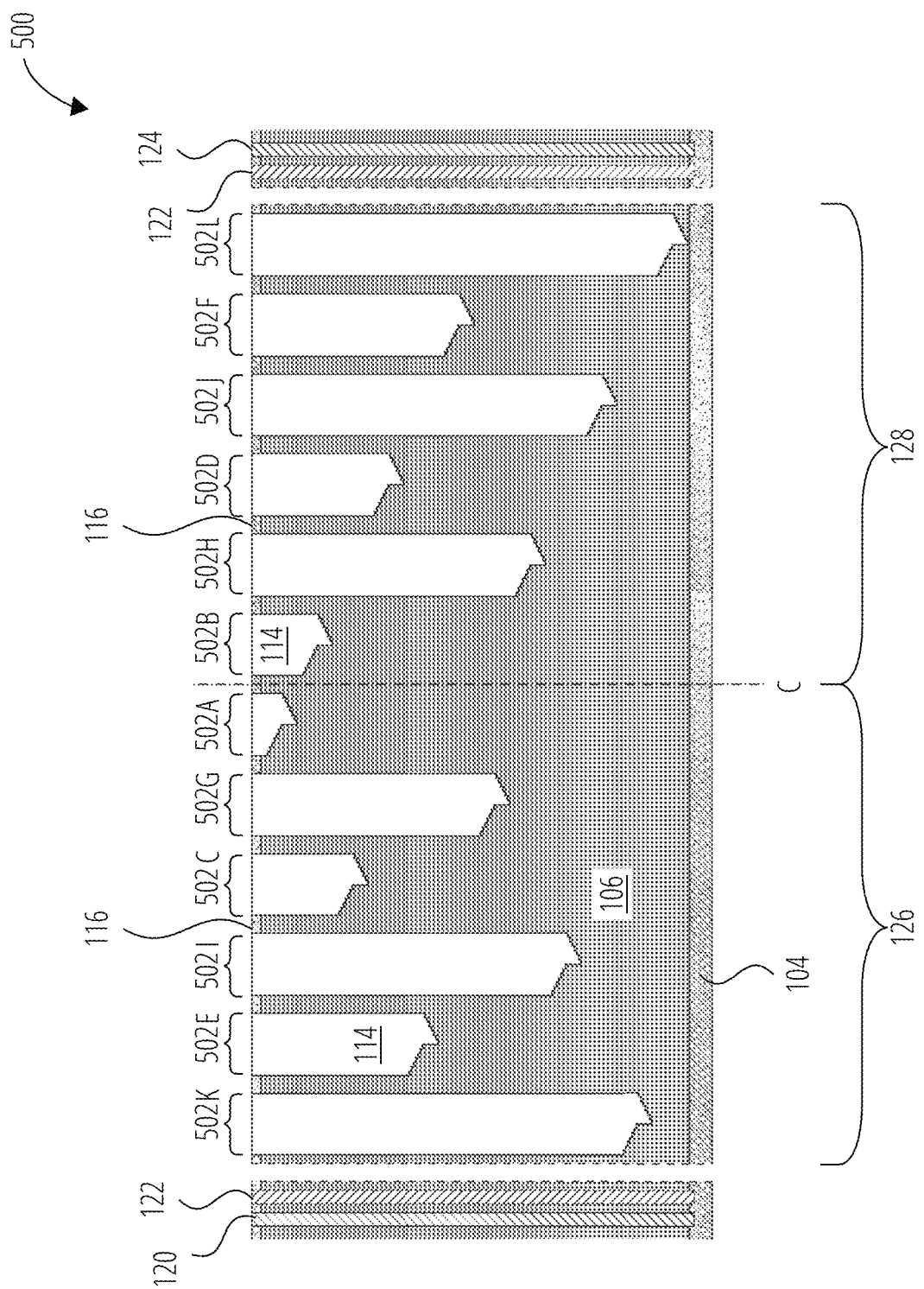
FIG. 5 is a cross-sectional, front, elevational, schematic illustration of a microelectronic device structure, according to embodiments of the disclosure, with substantially symmetrically distributed stadiums, wherein shallower stadiums are interspersed with deeper stadiums, the stadiums having offset opposing staircase structures like that of FIG. 2A.

For example, FIG. 5 illustrates a device structure 500 in which relatively shallow stadiums are interspersed with relatively deeper stadiums. As illustrated, the left-side portion 126 includes—in lateral order from furthest from the centerline C to closest to the centerline C—stadiums 502K, 502E, 502I, 502C, 502G, and 502A; while the right-side portion 128 includes—in lateral order from further from the centerline C to closest to the centerline C—stadiums 502L, 502F, 502J, 502D, 502H, and 502B. As with the other embodiments of the disclosure, "A" (in association with a stadium designation) designates a shallowest stadium of a distribution, "B" designates a second-shallowest stadium of a distribution, and so on.

As in other embodiments of the disclosure, the volume of the fill material 114 occupying the stadiums 502K, 502E, 502I, 502C, 502G, and 502A in the left-side portion 126 is substantially equal to the volume of the fill material 114 occupying the stadiums 502L, 502F, 502J, 502D, 502H, and 502B in the right-side portion 128. Therefore, material stresses may be substantially equal and balanced between the left-side portion 126 and the right-side portion 128, and bending of the neighboring active pillars (e.g., left-side pillar 120, right-side pillar 124) may be avoided or at least may be mitigated with a minimal and equal number of dummy pillars 122 adjacent the left-side portion 126 as adjacent the right-side portion 128.

Any or all of the stadiums 502A-L may be configured with the staircase arrangement of either of the stadium 102B of FIG. 2A or the stadium 102B' of FIG. 2B. Therefore, the descriptions of the stadium 102B of FIG. 2A or the stadium 102B' of FIG. 2B may equally apply to any or all of the stadiums 502A-L of FIG. 5.

The device structure 500 also includes the crests 116 and the bridge 118 (FIG. 1A) described above with respect to, e.g., the device structure 100 of FIG. 1A and FIG. 1B. Therefore, the top plan cross-sectional view of FIG. 1A may be identical to a top plan cross-sectional view of the device structure 500 of FIG. 5, but with the alternative arrangement of stadium depths.

Accordingly, disclosed is a memory device comprising at least two arrays of memory cells vertically extending through a stack structure comprising tiers. Each of the tiers comprises a conductive structure and an insulative structure. A substantially symmetrical distribution of stadium structures is within the stack structure and is horizontally positioned between the at least two arrays of memory cells.

Thus, according to embodiments of the disclosure, stadiums are formed in a stack structure of vertically alternating insulative and conductive materials. The stadiums are substantially symmetrically distributed; therefore, substantially balanced are the volumes and material stresses of the fill material(s) within the stadiums (and of the materials of the stack structure in which the stadiums are formed). Because of the substantially balanced material stresses, laterally adjacent, operationally active pillars may, in some embodiments, not exhibit bending at all, avoiding the need for dummy pillars (e.g., non-operational pillars) to be included in the device to mitigate material stresses that may otherwise cause pillar bending. Therefore, the valuable footprint space that would be occupied by dummy pillars is available, instead, for formation of structures or materials configured to actively contribute to the functions and operation of the device. In other embodiments, if—with the symmetrical distribution of the stadiums—the active pillars nonetheless exhibit bending in the absence of dummy pillars, the bending may be minimal and may at least be of substantially equal bending amounts, due to the substantially equal material stresses on both lateral sides of the stadium distribution. Therefore, in such embodiments, a minimal and equal number of dummy pillars may be included on both lateral sides of the stadium distribution to mitigate pillar bending. Accordingly, by embodiments of the disclosure, the inclusion of dummy pillars may be avoided or, where not avoided, minimized and made consistent at both lateral sides of the distribution of stadiums, simplifying device design and fabrication.

With reference to FIG. 6A to FIG. 9, illustrated are various stages of a method of forming the device structures of embodiments of the disclosure, such as the device structure 100 of FIG. 1A, FIG. 1B, and FIG. 1C; the device structure 300 of FIG. 3, the device structure 400 of FIG. 4; and/or the device structure 500 of FIG. 5.

A stack of alternating materials 602 is formed (e.g., deposited) with vertically alternating insulative material 112 and another material 604 (FIG. 6B). The insulative material 112 and the other material 604 may be formed (e.g., deposited) in repeated sequence, one after the other, to form tiers 606 of the stack of alternating materials 602.

In some embodiments, the other material 604, of the stack of alternating materials 602, may be a sacrificial material (e.g., a nitride material, such as a silicon nitride material) that will eventually be replaced with conductive material (e.g., conductive material 110 of FIG. 1C). In other embodiments, the other material 604 is conductive when initially formed and is nonsacrificial, such that it is formed as the conductive material 110 (FIG. 1C) to be included in the final structure. In either such embodiments, the insulative material 112 of the stack of alternating materials 602 may be nonsacrificial, such that it remains the insulative material 112 of FIG. 1C, in the final structure of the device being fabricated.

A capping material 608 may be formed on the stack of alternating materials 602. The capping material 608 may include, e.g., a semiconductor material, such as polysilicon.

Staircases 610 are formed (e.g., etched) into the stack of alternating materials 602 at each of a number of horizontal positions P1 to P12 at which a stadium (e.g., each of the stadiums 102A-L of FIG. 1B, each of the stadiums 102A-102L' of FIG. 3, each of the stadiums 402A-L of FIG. 4, or each of the stadiums 502A-L of FIG. 5) is to be formed. At this stage, the staircases 610 may be formed as opposing staircases having a "V"-shaped arrangement, with the base of each of opposing staircases meeting at the same elevation. A portion of the capping material 608 may remain between each of the positions P1 to P12, which portions of the capping material 608 define crest portions 612.

Figure 6:
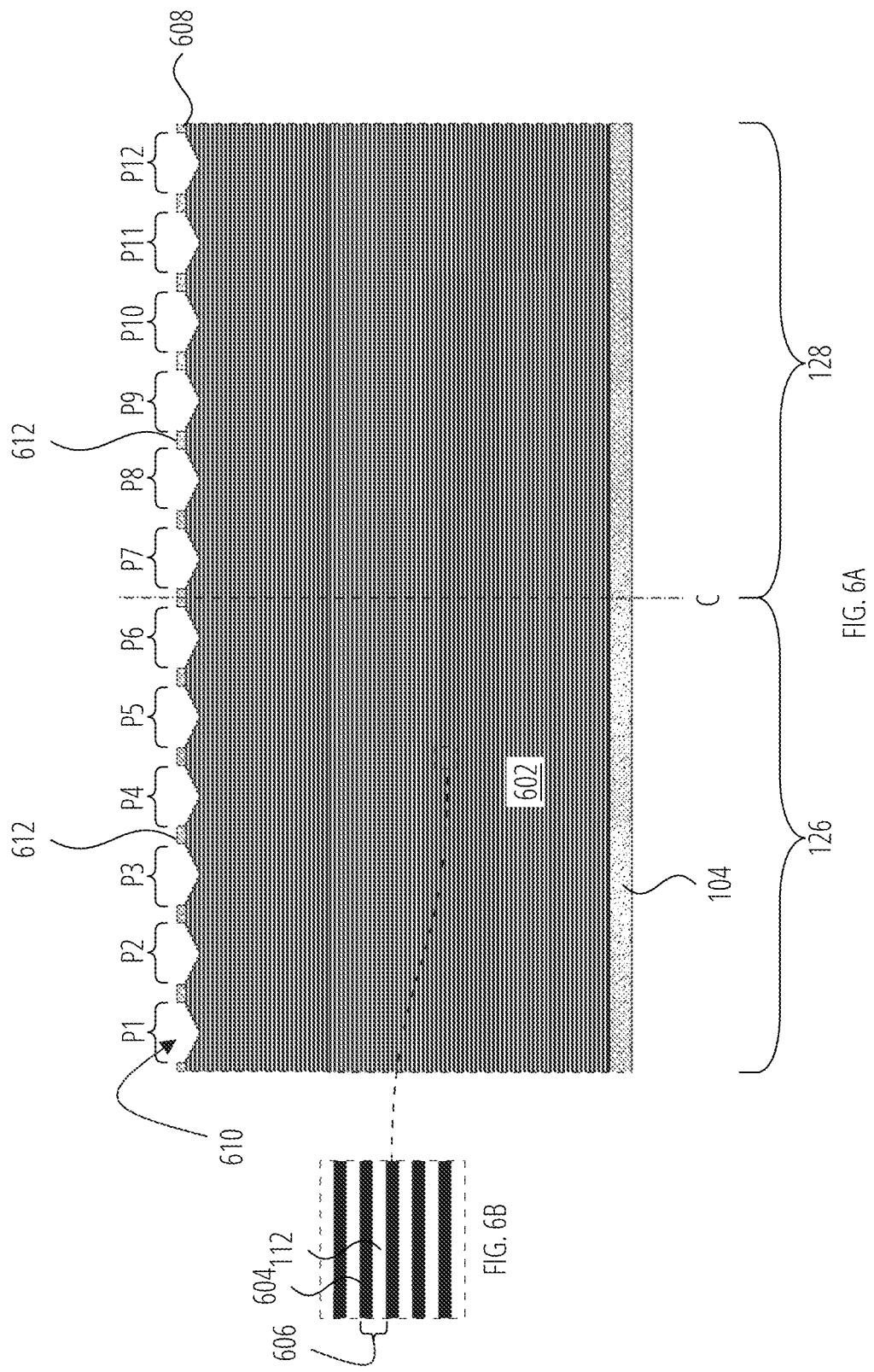
Figure 7:
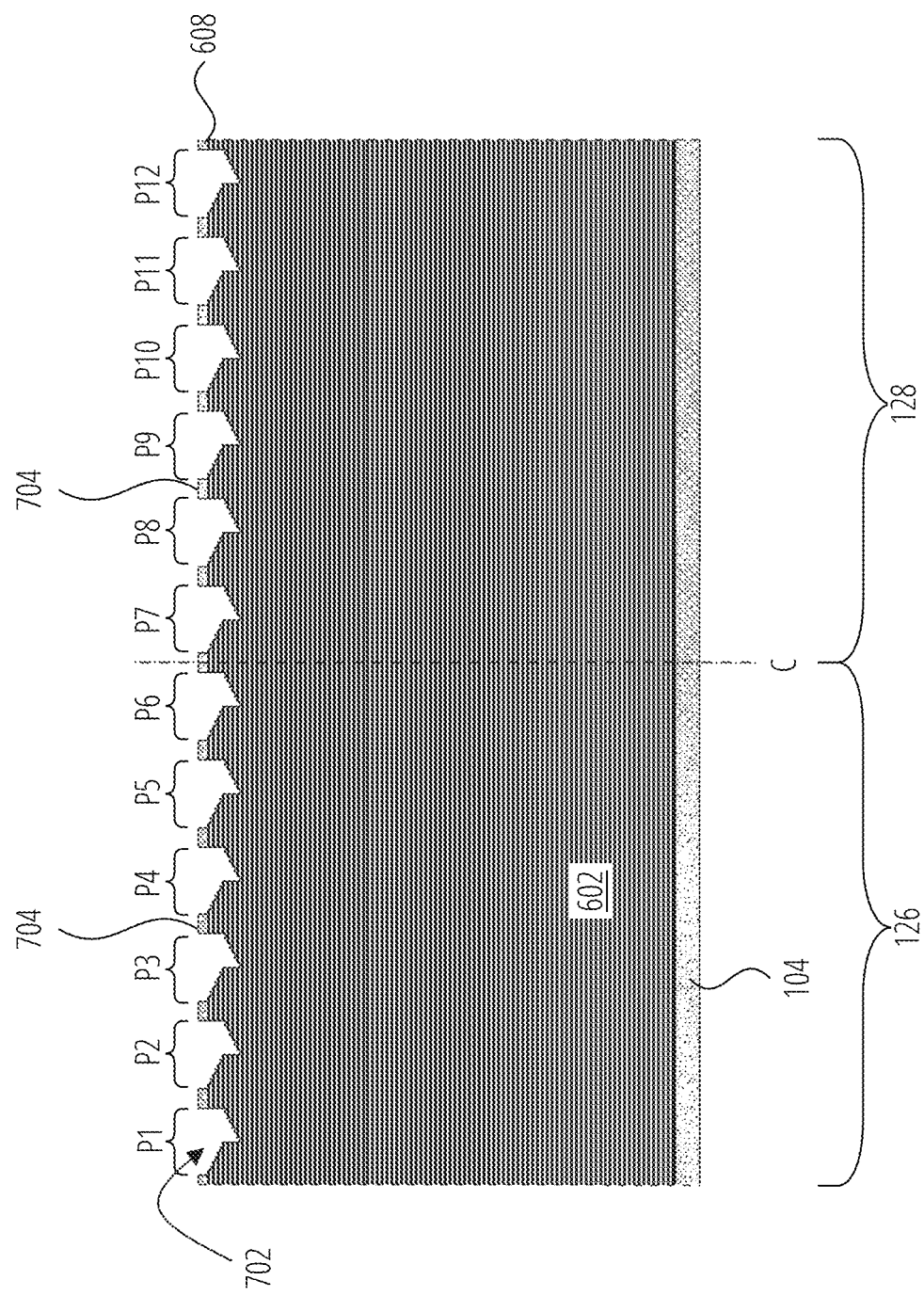

In embodiments in which the staircases of the stadiums to be formed are to be offset opposing staircases (e.g., like stadium 102B of FIG. 2A or stadium 102B' of FIG. 2B), one side of the staircases 610 of FIG. 6A is further formed (e.g., etched) to lower one of the opposing staircases, vertically offsetting it from the other of the opposing staircases, as illustrated in FIG. 7, forming an offset stadium shape 702 in each of the horizontal positions P1 to P12. The vertical offsetting also forms crest portions 704 that are somewhat extended from the crest portions 612 of FIG. 6A. Accordingly, the stage of FIG. 7 defines the staircase configuration to be included at the bottom of each of the stadiums to be formed, whatever that staircase configuration may be, if not already defined by the stage of FIG. 6.

Figure 8:
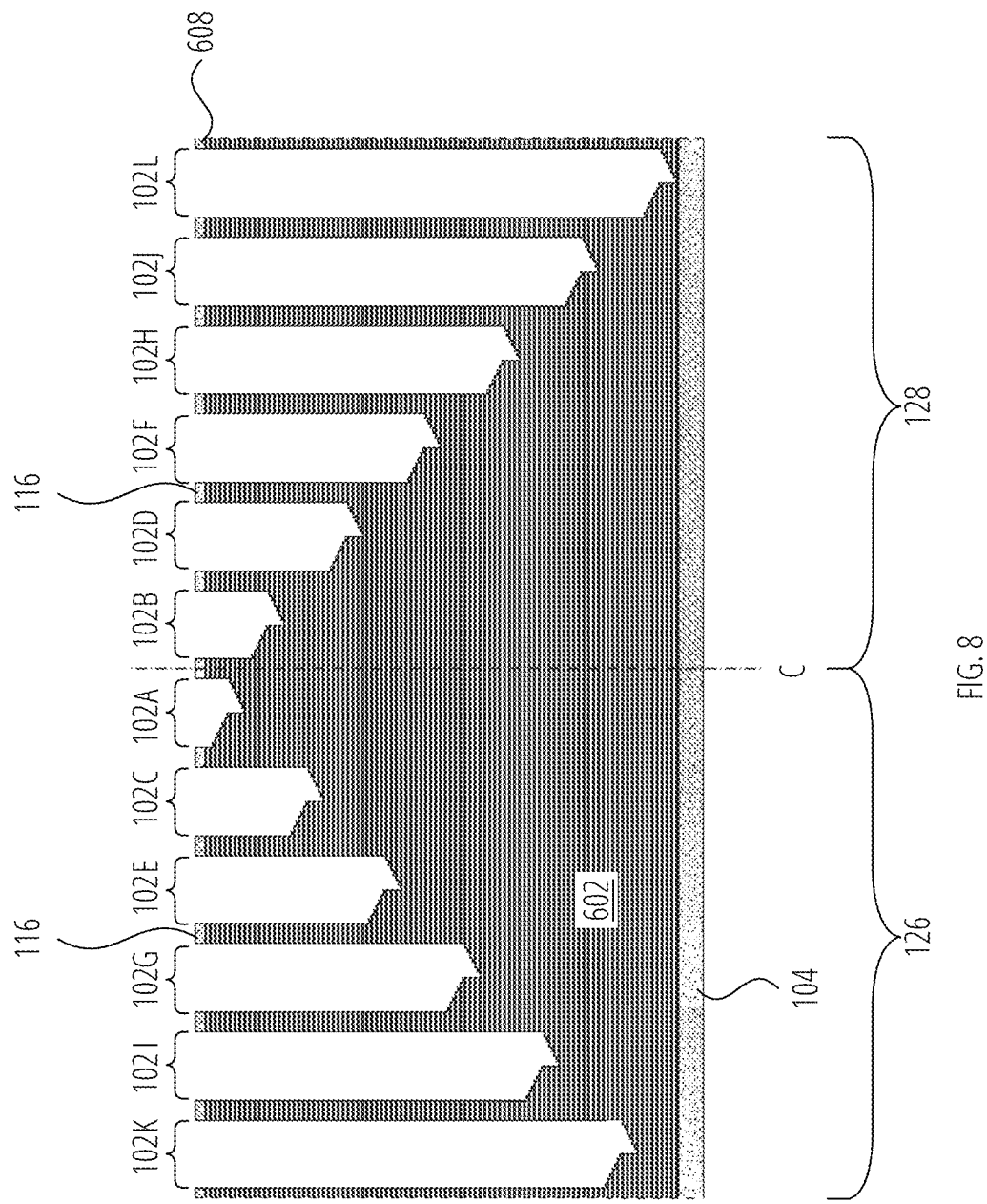

With reference to FIG. 8, the depths of the stadiums (e.g., stadiums 102A-L) may then be defined, e.g., by etching to an appropriate respective depth for each of the stadiums (e.g., stadiums 102A-L), forming a distribution of trenches at different depths from one another. Thus, at each of the horizontal positions P1 to P12 (FIG. 6), the respective offset stadium shape 702 of FIG. 7 is etched to a different depth of the stack of alternating materials 602.

In some embodiments, each of the stadiums 102A-L may be deepened to its final depth sequentially, with the depth of a shallowest stadium (e.g., stadium 102A) formed (e.g., etched) first (e.g., at horizontal position P6 of FIG. 6), the depth of a second-shallowest stadium (e.g., stadium 102B) formed next (e.g., at horizontal position P7 of FIG. 6), etc., until forming the depth of the deepest stadium (e.g., stadium 102L) (e.g., at horizontal position P12 of FIG. 6).

In other embodiments, all of the stadiums 102A-L may be etched concurrently to the depth of the shallowest stadium (e.g., stadium 102A). Then all deeper stadiums (e.g., stadiums 102B-L) may be etched concurrently to the depth of the second-shallowest stadium (e.g., stadium 102B). Then all deeper stadiums (e.g., stadiums 102C-L) may be etched concurrently to the depth of the third-shallowest stadium (e.g., stadium 102C), and so on until only the deepest stadium (e.g., stadium 102L) is etched to its final depth.

In still other embodiments, the shallowest stadium (e.g., the stadium 102A) may not be further etched after the stage of FIG. 7, such as when defining the offset stadium shape 702 (FIG. 7) already forms the shallowest stadium (e.g., the stadium 102A) at its final depth.

Extending the depths, as illustrated in FIG. 8, may define the final shape of the stadiums (e.g., the stadiums 102A-L) while also forming the crests 116 and the bridge 118 (FIG. 1A) for a microelectronic device having a CBSC arrangement of 3D NAND.

While FIG. 8 illustrates forming stadiums 102A-L of the W-shaped distribution of the device structure 100 of FIG. 1B, the alternative order or arrangement of the stadiums of any of the other device structures of embodiments of the disclosure may be formed by adjusting the relative horizontal position (e.g., at horizontal positions P1 to P12 of FIG. 7) for the respective stadium depths. For example, to form the V-shaped distribution of the stadiums 402A-L of the device structure 400 of FIG. 4, the shallowest stadium 402A would be formed (e.g., etched) at horizontal position P1 (FIG. 7) rather than at position P6 for the shallowest stadium 102A of the device structure 100 of FIG. 1B.

Figure 9:
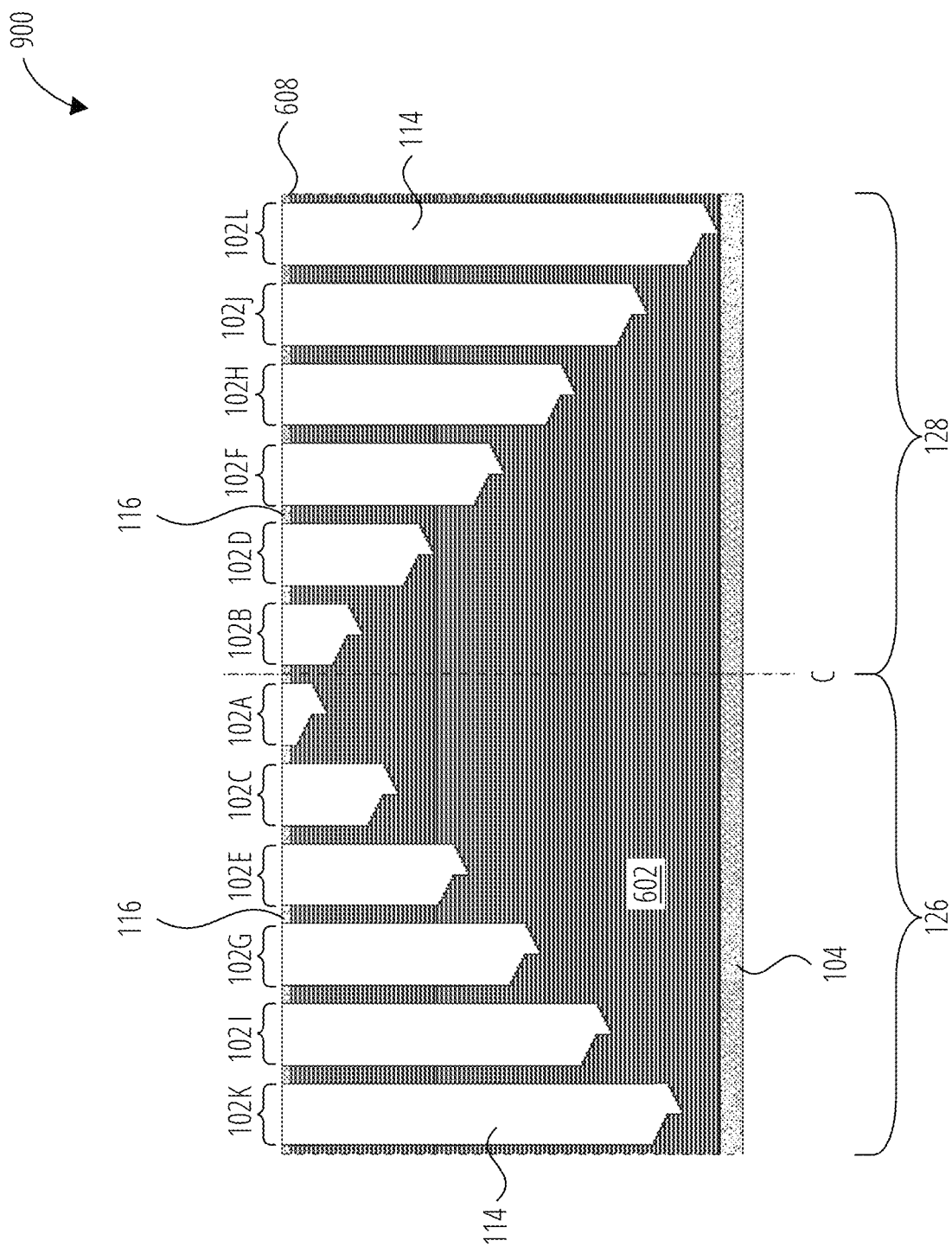

With reference to FIG. 9, a filled structure 900 may then be formed by forming (e.g., depositing) the fill material 114 to fill each of the stadiums (e.g., stadiums 102A-L). In some embodiments, the fill material 114 may be formed (e.g., deposited) to overfill the stadiums (e.g., stadiums 102A-L) and then planarized (e.g., by CMP) to expose the capping material 608 at the top of each of the crests 116 through the fill material 114.

As discussed above, the volume of the fill material 114 in the left-side portion 126 (e.g., in stadiums 102A, 102C, 102E, 102G, 102I, and 102K) is substantially equal to the volume of the fill material 114 in the right-side portion 128 (e.g., in stadiums 102B, 102D, 102F, 102H, 102J, and 102L) due to the substantially symmetrical distribution of the stadiums (e.g., stadiums 102A-L) about the centerline C. Therefore, any material stress imbalance between the fill material 114 and the stack of alternating materials 602 in the left-side portion 126 will be substantially equal to any material stress imbalance between the fill material 114 and the stack of alternating materials 602 in the right-side portion 128.

After forming the filled structure 900 of FIG. 9, the fabrication of the microelectronic device structure (e.g., the device structure 100 of FIG. 1) is completed. In embodiments in which the other material 604 (FIG. 6B) of the stack of alternating materials 602 is a sacrificial material, the other material 604 may be removed and replaced with the conductive material 110 (FIG. 1C) to form the stack structure 106, with the conductive material 110 providing "replacement gates" of the device structure 100. So-called "replacement gate" fabrication processes are known in the art, and so are not described in detail here. Accordingly, the final microelectronic device structure (e.g., the device structure 100 of FIG. 1B) may include replacement gate structures formed from the conductive material 110, which has replaced the other material 604 of FIG. 6B through FIG. 9.

In embodiments in which the other material 604 of FIG. 6B through FIG. 9 is non-sacrificial, the filled structure 900 of FIG. 9 is equivalent to the stadium distribution of the device structure 100 of FIG. 1B.

The active pillars (e.g., the left-side pillar 120 and the right-side pillar 124 of, e.g., FIG. 1B) and any dummy pillars 122 (e.g., FIG. 1B) may be formed before, during, or after forming the distribution of stadiums (e.g., stadiums 102A-L). Contacts may be formed to extend to the steps 202 (e.g., FIG. 2A, FIG. 2B) of the staircases SC1, SC2 of the stadiums (e.g., stadiums 102A-L), such as by forming contact openings through the fill material 114 and/or through portions of the stack of alternating materials 602 (or the stack structure 106 of, e.g., FIG. 1B) and then forming (e.g., depositing) conductive material in the contact openings.

Accordingly, disclosed is a method of forming a microelectronic device. The method comprises forming a stack structure. The stack structure comprises a vertically alternating sequence of materials arranged in tiers. Stadium structures are formed and vertically extend to different depths within the stack structure. A fill material is formed within trenches defined by the stadium structures. A volume of the fill material in the trenches defined by the stadium structures to a first lateral side of a centerline of a distribution of the stadium structures is substantially equal to a volume of the fill material in the trenches defined by the stadium structures to a second lateral side of the centerline of the distribution.

Figure 10:
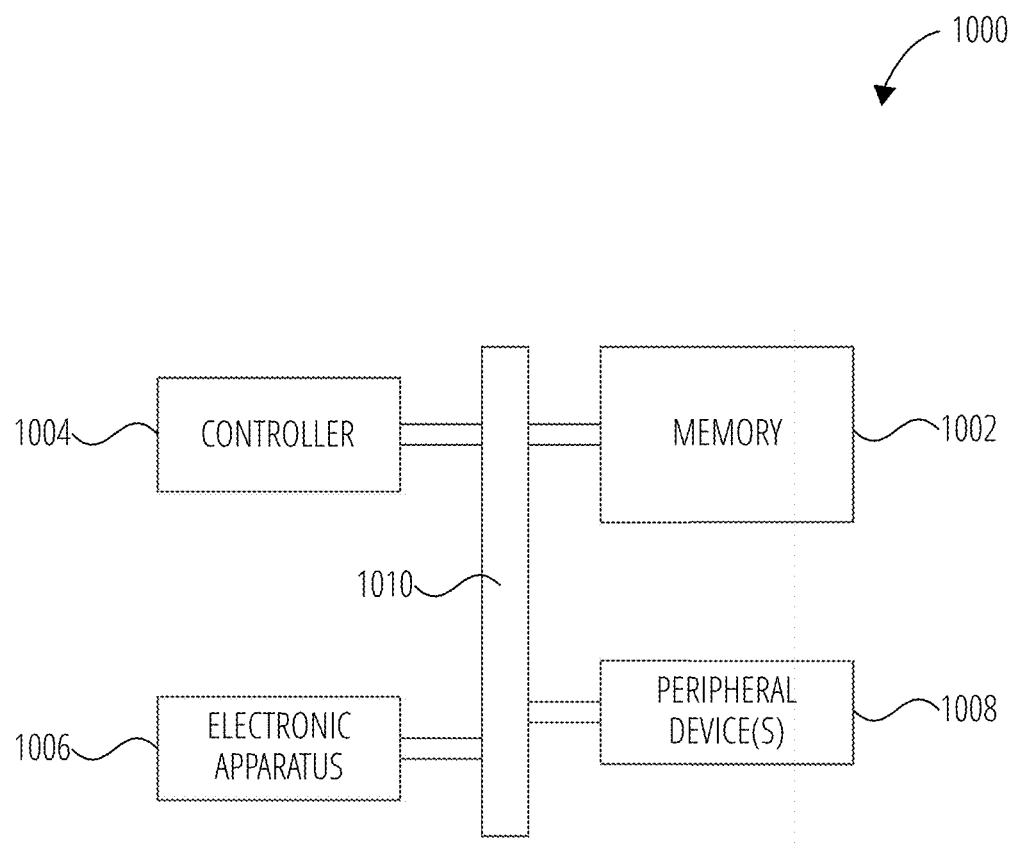
FIG. 10 shows a block diagram of an electronic system including a microelectronic device that includes a microelectronic device structure of embodiments of the disclosure.

FIG. 10 shows a block diagram of a system 1000, according to embodiments of the disclosure, which system 1000 includes memory 1002 including arrays of vertical strings of memory cells (e.g., adjacent active pillars, such as the left-side pillar 120 and the right-side pillar 124 of FIG. 1B, FIG. 3, FIG. 4, and/or FIG. 5) adjacent a substantially-symmetrical distribution of stadiums. Therefore, the architecture and structure of the memory 1002 may include one or more of the device structure 100 of FIG. 1A to FIG. 1C, the device structure 300 of FIG. 3, the device structure 400 of FIG. 4, and/or the device structure 500 of FIG. 5, according to embodiments of the disclosure, and may be fabricated according to one or more of the methods described above, e.g., with reference to FIG. 6A through FIG. 9.

The system 1000 may include a controller 1004 operatively coupled to the memory 1002. The system 1000 may also include another electronic apparatus 1006 and one or more peripheral device(s) 1008. The other electronic apparatus 1006 may, in some embodiments, include one or more of the device structure 100 of FIG. 1A to FIG. 1C, the device structure 300 of FIG. 3, the device structure 400 of FIG. 4, and/or the device structure 500 of FIG. 5, according to embodiments of the disclosure and fabricated according to one or more of the methods described above. One or more of the controller 1004, the memory 1002, the other electronic apparatus 1006, and the peripheral device(s) 1008 may be in the form of one or more integrated circuits (ICs).

A bus 1010 provides electrical conductivity and operable communication between and/or among various components of the system 1000. The bus 1010 may include an address bus, a data bus, and a control bus, each independently configured. Alternatively, the bus 1010 may use conductive lines for providing one or more of address, data, or control, the use of which may be regulated by the controller 1004. The controller 1004 may be in the form of one or more processors.

The other electronic apparatus 1006 may include additional memory (e.g., with one or more of the device structure 100 of FIG. 1A to FIG. 1C, the device structure 300 of FIG. 3, the device structure 400 of FIG. 4, and/or the device structure 500 of FIG. 5, according to embodiments of the disclosure and fabricated according to one or more of the methods described above). Other memory structures of the memory 1002 and/or the other electronic apparatus 1006 may be configured in an architecture other than 3D NAND, such as dynamic random access memory (DRAM), static random access memory (SRAM), synchronous dynamic random access memory (SDRAM), synchronous graphics random access memory (SGRAM), double data rate dynamic ram (DDR), double data rate SDRAM, and/or magnetic-based memory (e.g., spin-transfer torque magnetic RAM (STT-MRAM)).

The peripheral device(s) 1008 may include displays, imaging devices, printing devices, wireless devices, additional storage memory, and/or control devices that may operate in conjunction with the controller 1004.

The system 1000 may include, for example, fiber optics systems or devices, electro-optic systems or devices, optical systems or devices, imaging systems or devices, and information handling systems or devices (e.g., wireless systems or devices, telecommunication systems or devices, and computers).

Accordingly, disclosed is a system comprising a three-dimensional memory device, at least one processor in operable communication with the three-dimensional memory device, and at least one peripheral device in operable communication with the at least one processor. The three-dimensional memory device comprises arrays of vertical memory cells along pillar structures extending vertically through a stack structure comprising a vertically alternating sequence of insulative materials and conductive materials. Stadium structures are within the stack structure and are substantially symmetrically distributed between the arrays of vertical memory cells. Each of the stadium structures extend to different depths within the stack structure. A fill material is adjacent each of the stadium structures. A total volume of the fill material disposed to a first lateral side of a centerline of a distribution of the stadium structures is substantially equal a total volume of the fill material disposed to a second lateral side of the centerline. The centerline is between and equidistant from the arrays of vertical memory cells.

While the disclosed structures, apparatus (e.g., devices), systems, and methods are susceptible to various modifications and alternative forms in implementation thereof, specific embodiments have been shown by way of example in the drawings and have been described in detail herein. However, the disclosure is not intended to be limited to the particular forms disclosed. Rather, the disclosure encompasses all modifications, combinations, equivalents, variations, and alternatives falling within the scope of the disclosure as defined by the following appended claims and their legal equivalents.

What is claimed is:

1. A microelectronic device, comprising:
a stack structure comprising a vertically alternating sequence of insulative materials and conductive materials arranged in tiers;
a first pillar structure vertically extending through the stack structure;
a second pillar structure vertically extending through the stack structure; and
at least one row of stadium structures within the stack structure, the stadium structures of each of the at least one row being spaced from one another in a horizontal direction by crest portions of the stack structure, the stadium structures being collectively substantially symmetrically distributed in the horizontal direction between the first pillar structure and the second pillar structure, each of the stadium structures comprising staircase structures having steps comprising lateral ends of some of the tiers.

2. The microelectronic device of claim 1, wherein each of the stadium structures extends to a different depth within the stack structure than each other of the stadium structures.

3. The microelectronic device of claim 1, wherein each of the stadium structures comprises a first staircase structure, of the staircase structures, vertically offset from a second staircase structure, of the staircase structures.

4. The microelectronic device of claim 1, further comprising a bridge structure comprising some of the insulative materials and some of the conductive materials of the stack structure, the bridge structure horizontally extending along a rear of the stadium structures.

5. The microelectronic device of claim 1, wherein some of the stadium structures adjacent a centerline of the substantially symmetrical distribution are relatively deeper than others of the stadium structures adjacent the first pillar structure and are relatively deeper than still others of the stadium structures adjacent the second pillar structure.

6. The microelectronic device of claim 1, further comprising a dielectric fill material adjacent the staircase structures of each of the stadium structures.

7. A microelectronic device, comprising:
a stack structure comprising a vertically alternating sequence of insulative materials and conductive materials arranged in tiers;
a first pillar structure vertically extending through the stack structure;
a second pillar structure vertically extending through the stack structure; and
stadium structures within the stack structure and substantially symmetrically distributed between the first pillar structure and the second pillar structure, each of the stadium structures comprising staircase structures having steps comprising lateral ends of some of the tiers,
wherein some of the stadium structures adjacent a centerline of the substantially symmetrical distribution are relatively shallower than others of the stadium structures adjacent the first pillar structure and are relatively shallower than still others of the stadium structures adjacent the second pillar structure.

8. A memory device, comprising:
at least two arrays of memory cells vertically extending through a stack structure comprising tiers, each of the tiers comprising a conductive structure and an insulative structure; and
a substantially symmetrical distribution of stadium structures within the stack structure and positioned along a horizontal direction extending between the at least two arrays of memory cells, the stadium structures being spaced from one another in the horizontal direction by crest portions of the stack structure.

9. The memory device of claim 8, further comprising a fill material within trenches defined by the stadium structures.

10. The memory device of claim 8, wherein, of the stadium structures of the distribution, the stadium structures relatively proximate an array of the at least two arrays have relatively greater vertical depths than the stadium structures relatively distal from the at least two arrays of memory cells.

11. The memory device of claim 8, wherein, of the stadium structures of the distribution, the stadium structures relatively proximate an array of the at least two arrays have relatively lesser vertical depths than the stadium structures relatively distal from the at least two arrays of memory cells.

12. The memory device of claim 8, wherein, of the stadium structures of the distribution, stadium structures of relatively lesser vertical depths are horizontally interspersed with stadium structures of relatively greater vertical depths.

13. The memory device of claim 8, further comprising electrically-inoperative pillar structures adjacent the substantially symmetrical distribution of the stadium structures.

14. A memory device, comprising:
at least two arrays of memory cells vertically extending through a stack structure comprising tiers, each of the tiers comprising a conductive structure and an insulative structure;
a substantially symmetrical distribution of stadium structures within the stack structure and horizontally positioned between the at least two arrays of memory cells; and
electrically-inoperative pillar structures adjacent the substantially symmetrical distribution of the stadium structures,
wherein a number of the electrically-inoperative pillar structures adjacent a first lateral side of the substantially symmetrical distribution of the stadium structures equals a number of the electrically-inoperative pillar structures adjacent a second lateral side of the substantially symmetrical distribution.

15. A method of forming a microelectronic device, the method comprising:
forming a stack structure comprising a vertically alternating sequence of insulative materials and conductive materials arranged in tiers;
forming at least one row of stadium structures vertically extending to different depths within the stack structure, the stadium structures of each of the at least one row being spaced from one another in a horizontal direction by crest portions of the stack structure, each of the stadium structures comprising staircase structures having steps comprising lateral ends of some of the tiers;
forming a fill material within trenches defined by the stadium structures, a volume of the fill material in the trenches defined by the stadium structures to a first lateral side of a centerline of the distribution of the stadium structures substantially equaling a volume of the fill material in the trenches defined by the stadium structures to a second lateral side of the centerline of the distribution;

forming a first pillar structure vertically extending through the stack structure; and forming a second pillar structure vertically extending through the stack structure, the stadium structures being collectively substantially symmetrically distributed in the horizontal direction between the first pillar structure and the second pillar structure.

16. The method of claim 15, wherein forming the stack structure comprising the vertically alternating sequence of insulative materials and conductive materials arranged in tiers comprises, before forming the conductive materials, forming the insulative materials vertically alternating with a sacrificial material.

17. The method of claim 16, further comprising replacing the sacrificial material with the conductive materials.

18. The method of claim 17, wherein replacing the sacrificial material with the conductive materials follows forming the fill material within the trenches defined by the stadium structures.

19. The method of claim 15, wherein forming the stadiums structures vertically extending to the different depths within the stack structure comprises:

forming staircase structures at different horizontal positions along the stack structure; and at at least some of the different horizontal positions, extending the staircase structures to the different depths.

20. The method of claim 19, wherein forming the staircase structures comprises, at each of the different horizontal positions along the stack structure, forming a pair of opposing staircase structures of the staircase structures having the steps comprising lateral ends of the some of the tiers.

21. The method of claim 20, wherein forming the staircase structures further comprises, at the at least some of the different horizontal positions along the stack structure, extending one staircase structure of the pair of opposing staircase structures to vertically offset the one staircase structure from another of the pair.

22. The method of claim 20, wherein the extending of the one staircase structure of the pair of opposing staircase structures to vertically offset the one staircase structure from the other of the pair precedes the extending of the staircase structures to the different depths.

23. The method of claim 15, wherein forming the stack structure comprising the vertically alternating sequence of the insulative materials and the conductive materials arranged in tiers comprises forming an oxide material vertically interleaved with a nitride material.

24. A system, comprising:

a three-dimensional memory device comprising:

at least two arrays of memory cells vertically extending through a stack structure comprising tiers, each of the tiers comprising a conductive structure and an insulative structure;

a substantially symmetrical distribution of stadium structures within the stack structure and positioned along a horizontal direction extending between the at least two arrays of memory cells, each of the stadium structures extending to different depths within the stack structure, the stadium structures being spaced from one another in the horizontal direction by crest portions of the stack structure; and a fill material adjacent each of the stadium structures, a total volume of the fill material disposed to a first lateral side of a centerline of the substantially symmetrical distribution of the stadium structures substantially equaling a total volume of the fill material disposed to a second lateral side of the centerline, the centerline being between and equidistant from the at least two arrays of memory cells;

at least one processor in operable communication with the three-dimensional memory device; and at least one peripheral device in operable communication with the at least one processor.

25. The system of claim 24, wherein the three-dimensional memory device further comprises dummy pillar structures, an equal number of the dummy pillar structures disposed to the first lateral side of the centerline as disposed to the second lateral side of the centerline.

26. The system of claim 24, wherein, of the stadium structures, the stadium structures relatively nearer the centerline are relatively shallower than the stadium structures relatively distal from the centerline.

27. The system of claim 24, wherein, of the stadium structures, the stadium structures relatively nearer the centerline are relatively deeper than the stadium structures relatively distal from the centerline.

* * * * *